(12) United States Patent
Nath et al.

(10) Patent No.: US 12,125,842 B2
(45) Date of Patent: Oct. 22, 2024

(54) VERTICALLY STACKED DIODE-TRIGGER SILICON CONTROLLED RECTIFIER

(71) Applicant: GLOBALFOUNDRIES U.S. Inc., Malta, NY (US)

(72) Inventors: Anindya Nath, Essex Junction, VT (US); Souvick Mitra, Essex Junction, VT (US)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 105 days.

(21) Appl. No.: 17/831,545

(22) Filed: Jun. 3, 2022

(65) Prior Publication Data
US 2023/0395591 A1  Dec. 7, 2023

(51) Int. Cl.
*H01L 27/02* (2006.01)
*H01L 29/66* (2006.01)
*H01L 29/74* (2006.01)

(52) U.S. Cl.
CPC .... *H01L 27/0262* (2013.01); *H01L 29/66371* (2013.01); *H01L 29/7412* (2013.01)

(58) Field of Classification Search
CPC ............ H01L 27/0262; H01L 27/0928; H01L 27/098; H01L 27/1027; H01L 27/1028; H01L 27/105; H01L 27/0255; H01L 29/66371; H01L 29/04; H01L 29/083; H01L 29/0834; H01L 29/0839; H01L 29/0843; H01L 29/0847; H01L 29/0882; H01L 29/1012; H01L 29/1016; H01L 29/7302; H01L 29/7306; H01L 29/7317; H01L 29/74; H01L 29/7404; H01L 29/7412; H01L 29/742; H01L 29/7424; H01L 29/7432; H01L 29/7436; H01L 29/744; H01L 29/102; H01L 29/1058; H01L 29/1066; H01L 29/745; H01L 29/7455; H01L 29/747; H01L 29/749; H01L 29/6609; H01L 29/66106; H01L 29/66893; H01L 29/66901; H01L 29/66916; H01L 29/66136; H01L 29/66128; H01L 29/66121; H01L 29/66151; H01L 29/66159
USPC ... 257/107, 133, 141, 347, 146, 77, E29.335
See application file for complete search history.

(56) References Cited

U.S. PATENT DOCUMENTS

| | | | |
|---|---|---|---|
| 9,012,955 B2* | 4/2015 | Fonteneau | H01L 29/749 438/157 |
| 10,008,491 B1* | 6/2018 | Li | H01L 23/66 |
| 10,475,885 B2* | 11/2019 | Deivasigamani | H01L 29/7816 |
| 2004/0065923 A1* | 4/2004 | Chang | H01L 27/0262 257/358 |
| 2009/0185316 A1* | 7/2009 | Schneider | H01L 27/0255 257/E21.357 |
| 2013/0175549 A1* | 7/2013 | Okumura | H01L 29/7808 257/77 |
| 2020/0411504 A1 | 12/2020 | Mitra et al. | |

(Continued)

*Primary Examiner* — Natalia A Gondarenko
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to vertically stacked diode-trigger silicon controlled rectifiers and methods of manufacture. The structure includes: a silicon controlled rectifier in a trap rich region of a semiconductor substrate; and at least one diode built in polysilicon (gate material) and isolated by a gate-dielectric.

17 Claims, 2 Drawing Sheets

(56) References Cited

U.S. PATENT DOCUMENTS

2021/0280699 A1    9/2021   Nath et al.
2023/0022588 A1*   1/2023   Mao .................... H01L 29/747

\* cited by examiner

VERTICALLY STACKED DIODE-TRIGGER SILICON CONTROLLED RECTIFIER

BACKGROUND

The present disclosure relates to semiconductor structures and, more particularly, to vertically stacked diode-trigger silicon controlled rectifiers and methods of manufacture.

A silicon controlled rectifier (SCR) or semiconductor controlled rectifier is a four-layer solid-state current-controlling device. SCRs are unidirectional devices (i.e. can conduct current only in one direction) and are triggered normally by a positive current going into the gate structure. SCRs are mainly used in devices where the control of high power, possibly coupled with high voltage, is required, e.g., as power regulators and motor controls.

Similarly, a diode is an electrical component that allows the flow of current in only one direction. Typically, a large radio-frequency (RF) swing causes junction breakdown, poor voltage scaling and harmonics distortion in bulk string diodes formed using emitters and bases of vertical bipolars and used as electrostatic discharge (ESD) protection for RF-switches. Also, relying on the switch self-protection often time results in lower ESD protection levels than desired.

SUMMARY

In an aspect of the disclosure, a structure comprises: a silicon controlled rectifier on a trap rich region of a semiconductor substrate; and at least one diode over the trap rich region of the semiconductor substrate.

In an aspect of the disclosure, a structure comprises: a silicon controlled rectifier on a trap rich region of a silicon substrate; and at least one diode vertically integrated with the silicon controlled rectifier, the at least one diode includes a P+ region and N+ region in polysilicon and isolated from an underlying semiconductor substrate by a gate dielectric material.

In an aspect of the disclosure, a method comprises: forming a silicon controlled rectifier on a trap rich region of a semiconductor substrate; and forming at least one diode over the trap rich region of the semiconductor substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to vertically stacked diode-trigger silicon controlled rectifiers and methods of manufacture. More specifically, the vertically stacked diode-trigger silicon control rectifiers (SCR) include trigger diodes vertically stacked on the SCR, with the entirety of the structure on a trap-rich semiconductor substrate (e.g., silicon). Advantageously, the vertically stacked diode-trigger silicon controlled rectifiers eliminate the Darlington effect, in addition to providing low capacitance and low harmonic distortion (compared to bulk counterparts) in an area efficient manner. Moreover, the fabrication processes do not require any additional masking steps.

In more specific embodiment, a vertically stacked diode-trigger SCR includes trigger diodes vertically stacked above the SCR (above a gate dielectric on the SCR). The structure is built on trap-rich silicon (e.g., with insulating behavior). The trigger diodes may be in a polysilicon layer above the SCR. The trigger diodes may also be arranged in series to increase trigger voltage. The diode strings may be oriented perpendicular to the SCR width to minimize the anode to cathode distance in the SCR. In further embodiments, the trigger device could be NPN or PNP in polysilicon material.

The vertically stacked diode-trigger SCR of the present disclosure can be manufactured in a number of ways using a number of different tools. In general, though, the methodologies and tools are used to form structures with dimensions in the micrometer and nanometer scale. The methodologies, i.e., technologies, employed to manufacture the vertically stacked diode-trigger SCR of the present disclosure have been adopted from integrated circuit (IC) technology. For example, the structures are built on wafers and are realized in films of material patterned by photolithographic processes on the top of a wafer. In particular, the fabrication of the vertically stacked diode-trigger SCR uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
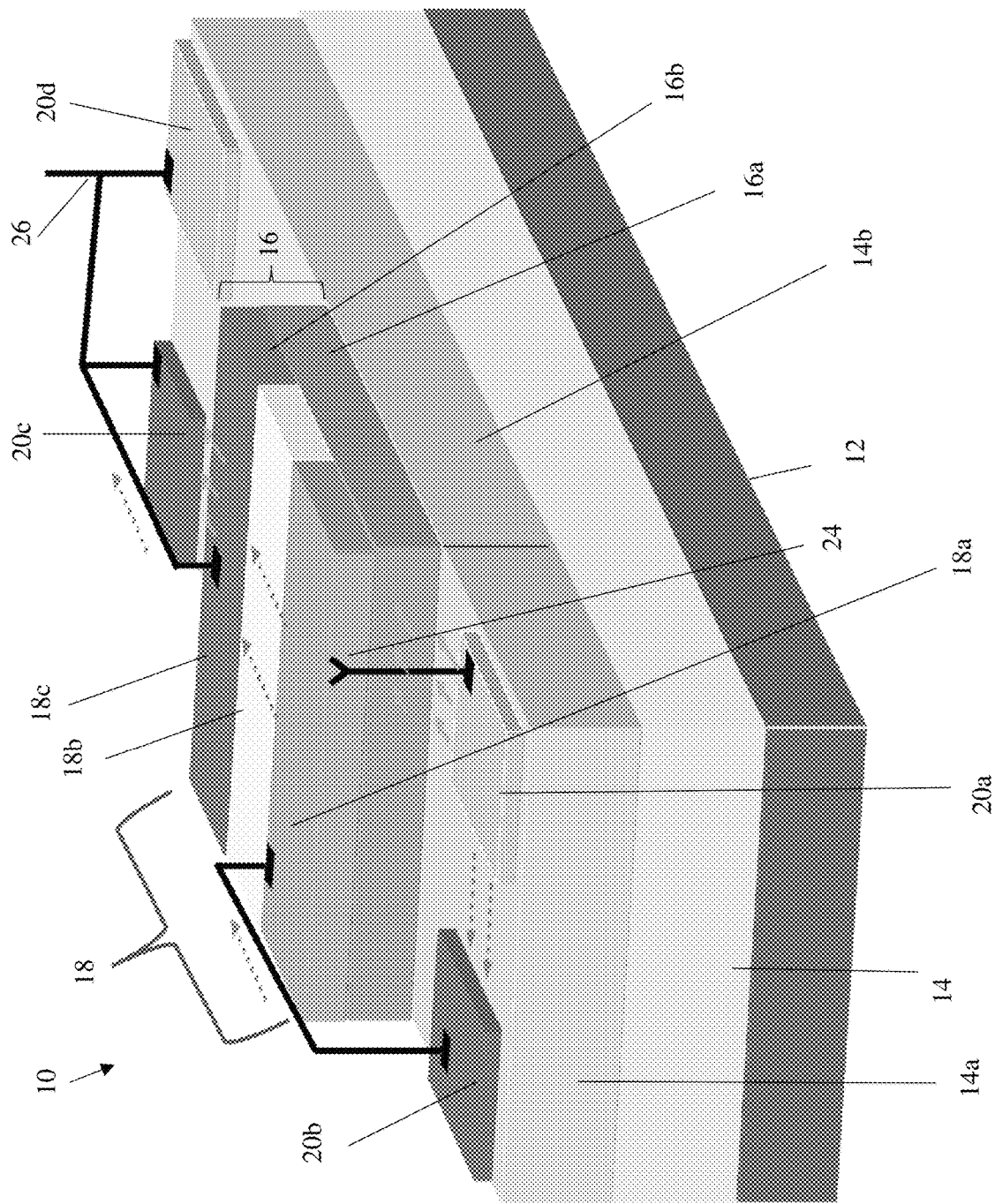
FIG. 1 shows a vertically stacked diode-trigger silicon controlled rectifier in accordance with aspects of the present disclosure.

FIG. 1 shows a vertically stacked diode-trigger silicon controlled rectifier in accordance with aspects of the present disclosure. In particular, the vertically stacked diode-trigger silicon controlled rectifier 10 includes a semiconductor substrate 12. In embodiments, the semiconductor substrate 12 may be a trap-rich semiconductor material comprising amorphous semiconductor material such as amorphous Si material. In embodiments, the trap-rich region 14 may be composed of other semiconductor material comprising defects. In alternative embodiments, the semiconductor substate 12 may be bulk semiconductor materials.

In one exemplary embodiment, the defects may be provided by an implant process using an inert gas, e.g., an argon implant, followed by a thermal anneal. In more specific embodiments, the trap trap-rich semiconductor substrate 12 may be an amorphous semiconductor material such as polysilicon, Si or other semiconductor material comprising defects. In one exemplary embodiment, the defects may be provided by an implant process using an inert gas, e.g., an argon implant process at a low dose and energy followed by an anneal process. For example, the argon implant can be at a dose of 30 Kev to 500 Kev (compared to a standard implantation dosage of about 900 Kev), and the energy can be at 1e14 to 1e15 (compared to a standard energy of 1e16). Other implants may be, e.g., xenon (Xe), arsenic (As), or germanium (Ge) as is known in the art such that no further explanation is required for a complete understanding of the present disclosure.

Still referring to FIG. 1, a semiconductor material 14 may be provided over the semiconductor substrate 12. In embodiments, the semiconductor material 14 may be Si material which includes an n-well 14a and a p-well 14b. The semiconductor material 14 (as well as the trap-rich semiconductor substrate 12) may include any suitable material including, but not limited to, Si, SiGe, SiGeC, SiC, GaAs, InAs, InP, and other III/V or II/VI compound semiconductors or any combinations thereof.

In embodiments, the n-well 14a and the p-well 14b may be formed by introducing a concentration of a different dopant of opposite conductivity type in the semiconductor material 14 using an ion implantation process. By way of example, in embodiments, respective patterned implantation masks may be used to define selected areas, e.g., the n-well 14a and the p-well 14b, exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The p-well 14b is doped with p-type dopants, e.g., Boron (B), and the n-well 14a is doped with n-type dopants, e.g., Arsenic (As), Phosphorus (P) and Sb, among other suitable examples.

A gate structure 16 may be formed over the semiconductor material 14 and, more specifically, over the p-well 14b. In embodiments, the gate structure 16 includes a gate dielectric material 16a on the semiconductor material 14 and a polysilicon material 16b on the gate dielectric material 16a. The gate dielectric material 16a may be any gate dielectric material 16a used in the fabrication process of gate structures. For example, the gate dielectric material 16a may be a low-k dielectric material, e.g., oxide, or a high-k dielectric material. The high-k dielectric material may be, e.g., $HfO_2Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

In embodiments, the gate structure 16 may be fabricated using conventional CMOS processes. For example, in standard CMOS processing, the gate dielectric material 16a and polysilicon material 16b are formed, e.g., deposited, onto the substrate semiconductor material 14, followed by a conventional patterning process, e.g., lithography and etching processes. The deposition of the gate dielectric material 16a may be any appropriate deposition process, e.g., an atomic layer deposition (ALD) or plasma enhanced chemical vapor deposition. The polysilicon material 16b may also be deposited by any appropriate deposition process, e.g., a chemical vapor deposition (CVD). As standard gate fabrication processes are used, it should be recognized that the gate dielectric material 16a is not a shallow trench isolation structure.

FIG. 1 further shows a trigger diode 18 formed from the polysilicon material 16b and which is vertically integrated with the SCR. More specifically, the trigger diode 18, for example, includes a P+ region 18a, a p-well region 18b and an N+ region 18c. In embodiments, the P+ region 18a, p-well region 18b and N+ region 18c may be formed by ion implantation processes as already described herein, with the P+ region having a higher concentration of p-type dopant than the p-well region 18b.

A plurality of diffusion regions 20a, 20b, 20c and 20d are formed on the semiconductor material 14 on the sides of the gate structure 16. In embodiments, the diffusion regions 20a, 20b, 20c and 20d are formed in the same processes as source/drain diffusion regions of other gate structures (hence eliminating the need for any additional steps). For example, the diffusion regions 20a, 20b, 20c and 20d may be fabricated using ion implantation processes as described herein, or alternatively they may be raised semiconductor epitaxial regions which are doped in-situ in a deposition chamber. The epitaxial processes include selectively growing a semiconductor material on the semiconductor material 14. In accordance with exemplary embodiments, epitaxy regions include Si; although other semiconductor materials are contemplated herein. The epitaxy regions may be implanted with a p-type or an n-type impurity to form the diffusion regions 20a, 20b, 20c and 20d.

In embodiments, the diffusion region 20a may be a P+ diffusion region and the diffusion region 20b may be an N+ diffusion region, both on the n-well 14a of the semiconductor material 14. On the other hand, the diffusion region 20c may be a N+ diffusion region and the diffusion region 20d may be a P+ diffusion region, both on the p-well 14b of the semiconductor material 14. It should be recognized that a rapid thermal annealing process may be performed after any of the implant processes to drive in the dopant into the semiconductor substrate 14, the gate structure 16 and diffusion regions 20b, 20c and 20d.

The diffusion region 20a may be electrically connected to an anode 24; whereas the diffusion region 20d may be electrically connected to a cathode 26. Moreover, the diffusion region 20b may be electrically connected to the trigger diode 18, e.g., the P+ region 18a and N+ region 18c may be electrically connected to the diffusion region 20c and the cathode 26.

As should be understood by those of skill in the art, each of the electrical connections may include a silicide contact. The silicide process begins with deposition of a thin transition metal layer, e.g., nickel, cobalt or titanium, over fully formed and patterned semiconductor devices (e.g., doped or ion implanted diffusion regions 20a, 20b, 20d and the P+ region 18a and N+ region 18c of the trigger diode 18. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device.

In operation, prior to the SCR being turned on, the current will flow from the trigger diode 18 from an anode side to a cathode side of the SCR in the following manner as depicted by the dashed arrow in FIG. 1: (i) from the diffusion region 20a (e.g., anode 24), (ii) to the diffusion region 20b, (iii) through the trigger diode 18, e.g., in the direction of the +P region 18a, p-well region 18b and N+ region 18c, and (iv) to the n+ diffusion 20c to the cathode 26. In contrast, when the SCR is turned on, the current will flow in the following manner as depicted by the solid arrow in FIG. 1, i.e., from the diffusion region 20a (e.g., anode 24) to the p-well 14b to the n-well 14a and through the semiconductor material underneath the trigger diode 18 to the cathode 26. Accordingly, it should be understood that the SCR comprises a PNPN structure.

Figure 2:
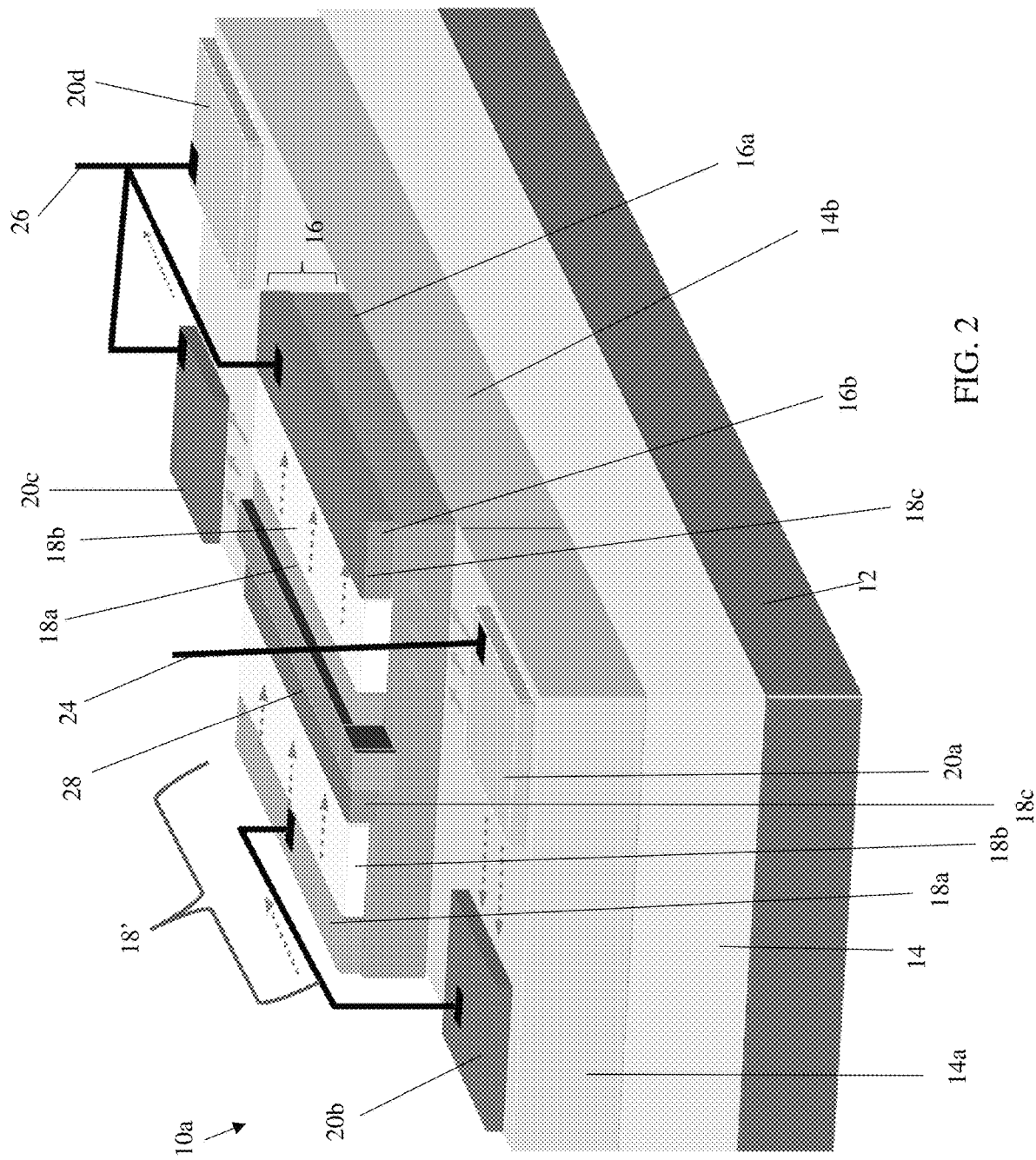
FIG. 2 shows a vertically stacked diode-trigger silicon controlled rectifier in accordance with additional aspects of the present disclosure.

FIG. 2 shows a vertically stacked diode-trigger silicon controlled rectifier in accordance with additional aspects of the present disclosure. In the vertically stacked diode-trigger silicon controlled rectifier 10a of FIG. 2, trigger diodes 18' may be arranged in series to increase trigger voltage. Although two trigger diodes are shown in series, it should be understood by those of skill in the art that any number of trigger diodes, e.g., three, are also contemplated herein. In this implantation, a silicide block 28 may be provided between the each of the trigger diodes in series, e.g., between the wells 18a and 18c of respective diodes. It should also be understood that the trigger diodes, in this implementation, may comprises NPN or PNP combinations provided in the polysilicon material 16b. Moreover, the trigger diodes 18' can be oriented perpendicular to the SCR width to minimize the anode to cathode distance of the SCR.

In operation, prior to the SCR being turned on, the current will flow from the anode side to the cathode side in the following manner as depicted by the dashed arrow in FIG. 2: (i) from the diffusion region 20a (e.g., anode 26), (ii) to the diffusion region 20b, (iii) through the series trigger diodes 18', e.g., in the direction of the +P region 18a, p-well region 18b and N+ region 18c of each trigger diode (and through the silicide block 28 between the series diodes), and (iv) to cathode 26. In contrast, when the SCR is turned on, the current will flow in the following manner as depicted by the solid arrow in FIG. 2 from the anode side to the cathode side, i.e., from the diffusion region 20a (e.g., anode 24), to the p-well 14b to the n-well 14a, through the semiconductor material underneath the trigger diodes 18, to the cathode 26. Accordingly, it should be understood that the SCR comprises a PNPN structure.

The vertically stacked diode-trigger SCR can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
   a silicon controlled rectifier on a trap rich region of a semiconductor substrate; and
   at least one diode sitting on a gate dielectric material and comprising a first diffusion region of a first dopant type, a second diffusion region of a second dopant type and a third diffusion of the first dopant type separating the first diffusion region from the second diffusion region, over the trap rich region of the semiconductor substrate, wherein
   the at least one diode is provided in a polysilicon material comprising a P+ region and an N+ region, separated by and directly contacting a p-type diffusion region, each of which sit on and directly contact the gate dielectric material,
   the silicon rectifier comprises a P+ diffusion region connected to an anode, an N+ diffusion region connected to the P+ region of the at least one diode, a second N+ diffusion region connected to the N+ region of the at least one diode and a second P+ diffusion region connected to a cathode and the N+ diffusion region of the silicon rectifier, and
   the at least one diode is isolated from the semiconductor substrate by the gate dielectric material, the P+ diffusion region of the silicon rectifier connected to the anode and the N+ diffusion region of the silicon rectifier connected to the P+ region of the at least one diode are provided in an n-well, and the second N+ diffusion region of the of the silicon rectifier connected to the N+ region of the at least one diode and the second P+ diffusion region of the silicon rectifier connected to the cathode are provided in a p-well, and the p-well and the n-well directly contact the trap rich region.

2. The structure of claim 1, wherein the at least one diode is vertically above and integrated with the silicon controlled rectifier.

3. The structure of claim 1, wherein:
   the gate dielectric material is directly contacting the p-well of an underlying substrate above the trap rich region,
   the least one diode sitting on the gate dielectric material comprises a gate structure,
   the P+ diffusion region connected to the anode and the N+ diffusion region connected to the P+ region are provided on a first side of the gate structure; and
   the second N+ diffusion region connected to the N+ region and the second P+ diffusion region connected to the cathode are provided on a second side of the gate structure.

4. The structure of claim 1, wherein the at least one diode comprises a diode string comprising multiple diodes in polysilicon material.

5. The structure of claim 4, wherein the multiple diodes are in series.

6. The structure of claim 5, wherein the multiple diodes are connected by a silicide material.

7. The structure of claim 4, wherein the multiple diodes are oriented perpendicular to a width of the silicon controlled rectifier.

8. The structure of claim 1, wherein the trap rich region is defective silicon material.

9. The structure of claim 8, wherein the silicon controlled rectifier comprises a PNPN.

10. A structure comprising:
    a silicon controlled rectifier on a trap rich region of a silicon substrate; and
    at least one diode vertically integrated with the silicon controlled rectifier, the at least one diode includes a P+ region and N+ region in polysilicon and isolated from an underlying semiconductor substrate by being in direct contact with a gate dielectric material, the P+ region and N+ region being separated by a p-type diffusion region which is also in direct contact with the gate dielectric material, wherein the underlying semiconductor substrate comprises a p-well under the gate dielectric material and an n-well adjacent to the p-well the silicon controlled rectifier comprises an anode over the n-well and a cathode over the p-well;

the silicon rectifier comprises a P+ diffusion region connected to the anode, an N+ diffusion region connected to the P+ region of the at least one diode, a second N+ diffusion region connected to the N+ region of the at least one diode, and a second P+ diffusion region connected to the cathode and the N+ diffusion region; and the least one diode comprising a gate structure comprising the P+ region and the N+ region separated by the p-type diffusion region.

11. The structure of claim 10, wherein the at least one diode comprises a trigger element comprises multiple diodes in series, each of which comprise the P+ region and the N+ region separated by the p-type diffusion region.

12. The structure of claim 11, wherein the multiple diodes are electrically connected by a silicide.

13. The structure of claim 12, wherein the multiple diodes are oriented perpendicular to a width of the silicon controlled rectifier.

14. The structure of claim 10, wherein the trap rich region is defective silicon material.

15. The structure of claim 12, wherein:
the P+ diffusion region connecting to the anode and the N+ diffusion region connecting to the P+ region are provided on a first side of the gate structure; and the second N+ diffusion region connected to the N+ region and the second P+ diffusion region connected to the cathode are provided on a second side of the gate structure.

16. The structure of claim 10, wherein the silicon controlled rectifier comprises a PNPN.

17. A method comprising:

forming a silicon controlled rectifier on a trap rich region of a semiconductor substrate; and forming at least one diode sitting on a gate dielectric material and comprising a first diffusion region of a first dopant type, a second diffusion region of a second dopant type and a third diffusion of the first dopant type separating the first diffusion region from the second diffusion region, over the trap rich region of the semiconductor substrate, wherein the at least one diode is provided in a polysilicon material comprising a P+ region and an N+ region, separated by and directly contacting a p-type diffusion region, each of which sit on and directly contact the gate dielectric material, the silicon rectifier comprises a P+ diffusion region connected to an anode, an N+ diffusion region connected to the P+ region of the at least one diode, a second N+ diffusion region connected to the N+ region of the at least one diode and a second P+ diffusion region connected to a cathode and the N+ diffusion region of the silicon rectifier, and the at least one diode is isolated from the semiconductor substrate by the gate dielectric material, the P+ diffusion region of the silicon rectifier connected to the anode and the N+ diffusion region of the silicon rectifier connected to the P+ region of the at least one diode are provided in an n-well, and the second N+ diffusion region of the of the silicon rectifier connected to the N+ region of the at least one diode and the second P+ diffusion region of the silicon rectifier connected to the cathode are provided in a p-well, and the p-well and the n-well directly contact the trap rich region.

* * * * *